(12) United States Patent
Rülke et al.

(10) Patent No.: US 8,557,667 B2
(45) Date of Patent: Oct. 15, 2013

(54) SPACER FOR A GATE ELECTRODE HAVING TENSILE STRESS AND A METHOD OF FORMING THE SAME

(75) Inventors: Hartmut Rülke, Dresden (DE); Katja Huy, Dresden (DE); Markus Lenski, Dresden (DE)

(73) Assignee: Globalfoundries Inc., Grand Cayman, (KY)

( * ) Notice: Subject to any disclaimer, the term of this patent is extended or adjusted under 35 U.S.C. 154(b) by 1848 days.

(21) Appl. No.: 10/987,484

(22) Filed: Nov. 12, 2004

(65) Prior Publication Data

US 2005/0136606 A1 Jun. 23, 2005

(30) Foreign Application Priority Data

Dec. 19, 2003 (DE) .................................. 103 60 000

(51) Int. Cl.
*H01L 21/336* (2006.01)
(52) U.S. Cl.
USPC ............ 438/296; 438/221; 438/788; 438/792
(58) Field of Classification Search
USPC .................. 438/792, 786, 788, 791, 221, 296
See application file for complete search history.

(56) References Cited

U.S. PATENT DOCUMENTS

| | | |
|---|---|---|
| 6,333,218 B1 * | 12/2001 | Ngo et al. ...................... 438/221 |
| 2002/0142535 A1 | 10/2002 | Ho et al. ........................ 438/201 |
| 2003/0008453 A1 | 1/2003 | Kang et al. .................... 438/239 |
| 2003/0199175 A1 * | 10/2003 | Tang et al. .................... 438/791 |
| 2004/0200417 A1 * | 10/2004 | Hanawa et al. ............. 118/723 I |
| 2005/0040460 A1 * | 2/2005 | Chidambarrao et al. ..... 257/336 |

OTHER PUBLICATIONS

Ito et al., Mechanical Stress Effect of Etch-Stop Nitride and its Impact on Deep Submicron Transistor Design, Electron Devices Meeting, 2000. IDEM Technical Digest International, Dec. 10-13, 2000, pp. 10.7.1-10.7.4.*

* cited by examiner

*Primary Examiner* — Julio J Maldonado
(74) *Attorney, Agent, or Firm* — Williams, Morgan & Amerson, P.C.

(57) ABSTRACT

By reducing a deposition rate and maintaining a low bias power in a plasma atmosphere, a spacer layer, for example a silicon nitride layer, may be deposited that exhibits tensile stress. The amount of tensile stress is controllable within a wide range, thereby providing the potential for forming sidewall spacer elements that modify the charge carrier mobility and thus the conductivity of the channel region of a field effect transistor.

15 Claims, 6 Drawing Sheets

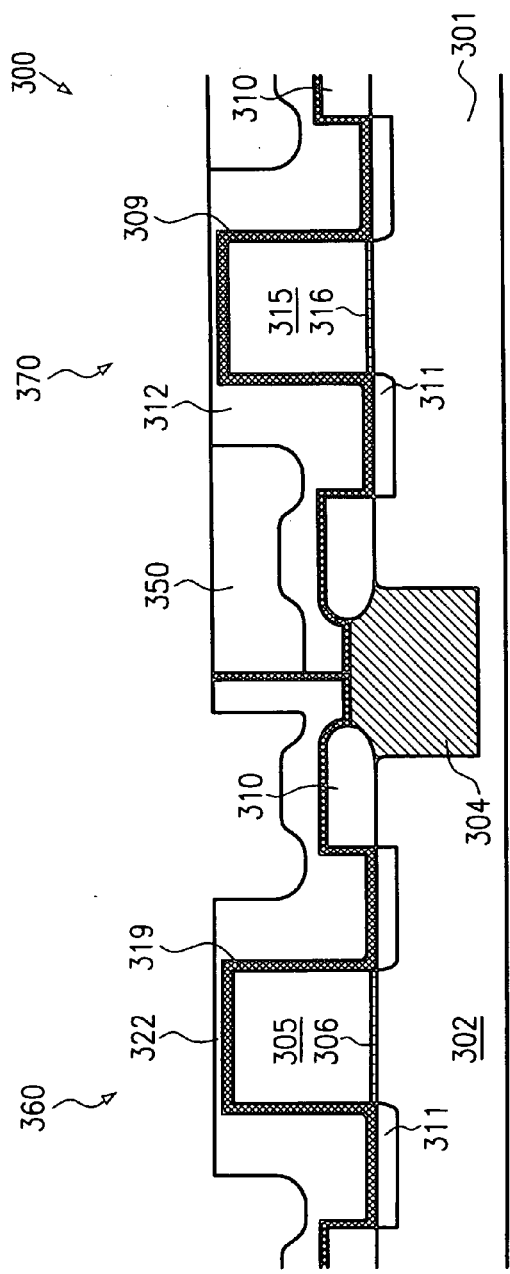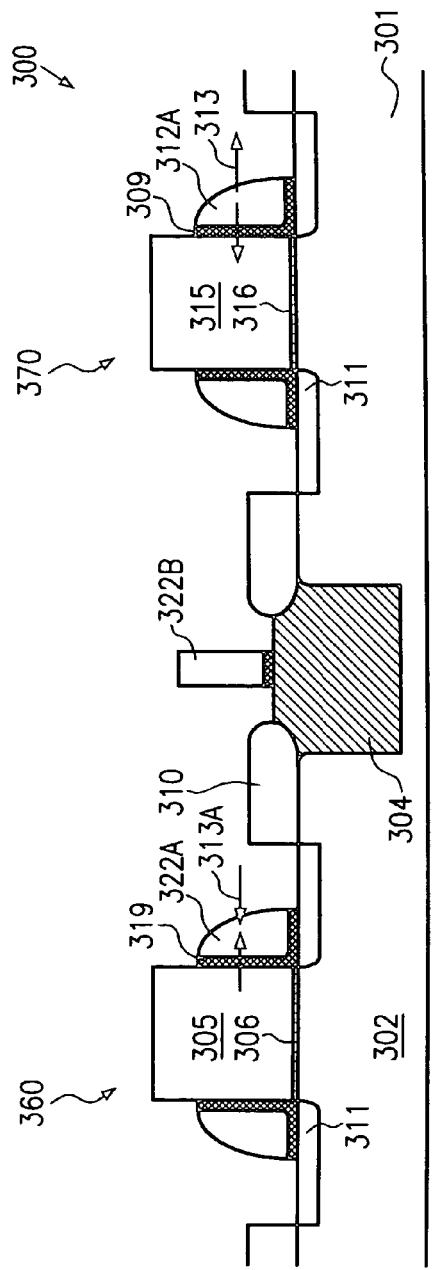

SPACER FOR A GATE ELECTRODE HAVING TENSILE STRESS AND A METHOD OF FORMING THE SAME

BACKGROUND OF THE INVENTION

1. Field of the Invention

Generally, the present invention relates to the formation of integrated circuits, and, more particularly, to the formation of spacer elements during the manufacturing of a gate electrode of a field effect transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach due to the superior characteristics in view of operating speed and/or power consumption. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source regions. The conductivity of the channel region, i.e., the drive current capability of the conductive channel, is controlled by a gate electrode formed above the channel region and separated therefrom by a thin insulating layer. The conductivity of the channel region upon formation of a conductive channel due to the application of an appropriate control voltage to the gate electrode depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions, however, entails a plurality of issues associated therewith that have to be addressed to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length also requires reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide an increased conductivity of the raised drain and source regions, while at the same time maintaining a shallow PN junction with respect to the gate insulation layer.

Irrespective of the technological approach used, sophisticated spacer techniques are necessary to create the highly complex dopant profile and to serve as a mask in forming metal silicide regions in the gate electrode and the drain and source regions in a self-aligned fashion. Since the continuous size reduction of the critical dimensions, i.e., the gate length of the transistors, necessitates the adaptation and possibly the new development of process techniques concerning the above-identified process steps, it has been proposed to enhance device performance of the transistor elements by increasing the charge carrier mobility in the channel region for a given channel length. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, thereby making a reduction of the dopant concentration a less attractive approach unless other mechanisms are developed to adjust a desired threshold voltage. Second, the lattice structure in the channel region may be modified, for instance by creating tensile or compressive stress, which results in a modified mobility for electrons and holes. For example, creating tensile stress in the channel region increases the mobility of electrons, wherein, depending on the magnitude of the tensile stress, an increase in mobility of up to 20% may be obtained, which, in turn, directly translates into a corresponding increase in the conductivity. On the other hand, compressive stress in the channel region may increase the mobility of holes, thereby providing the potential for enhancing the performance of P-type transistors. Consequently, it has been proposed to introduce, for instance, a silicon/germanium layer or a silicon/carbon layer in or below the channel region to create tensile or compressive stress. Although the transistor performance may be considerably enhanced by the introduction of stress-creating layers in or below the channel region, significant efforts have to be made to implement the formation of corresponding stress layers into the conventional and well-approved CMOS technique. For instance, additional epitaxial growth techniques have to be developed and implemented into the process flow to form the germanium or carbon-containing stress layers at appropriate locations in or below the channel region. Hence, process complexity is significantly increased, thereby also increasing production costs and the potential for a reduction in production yield.

In view of the above-described situation, there exists a need for an alternative technique that enables the creation of stress in the channel region without requiring complex and expensive epitaxial growth techniques.

The present invention is directed to overcoming, or at least reducing the effects of, one or more of the problems set forth above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of spacer elements adjacent to a gate electrode, wherein the spacer elements have tensile stress, which, in turn, may affect the carrier mobility in the channel region formed below the gate electrode and may affect the diffusivity of dopants, such as boron, phosphorous, and the like, in a rapid thermal anneal cycle for activating dopants and curing implantation-induced damage in the crystalline structure.

According to one illustrative embodiment of the present invention, a method of forming spacer elements comprises forming a gate electrode above a semiconductor region and depositing in a high frequency plasma atmosphere a spacer layer, such as a silicon and nitrogen containing layer, having tensile stress over the gate electrode and the semiconductor region. Then, the spacer layer is etched to form a spacer element having tensile stress.

According to a further illustrative embodiment of the present invention, a method of forming spacer elements comprises forming a first gate electrode and a second gate electrode above a semiconductor region. Thereafter, a first spacer layer having a first stress characteristic is deposited in a high frequency plasma atmosphere over the first and second gate electrodes and the semiconductor region. Next, the first spacer layer is selectively removed from the first gate electrode and a second spacer layer having a second stress characteristic other than the first stress characteristic is deposited over the first gate electrode. Finally, the first and second spacer layers are etched to form a first spacer element adjacent to the first gate electrode and a second spacer element adjacent to the second gate electrode.

BRIEF DESCRIPTION OF THE DRAWINGS

The invention may be understood by reference to the following description taken in conjunction with the accompanying drawings, in which like reference numerals identify like elements, and in which:

FIGS. 3a-3f schematically show cross-sectional views of two transistor elements during various stages of manufacture, wherein silicon nitride spacers of different stress characteristics are formed by plasma enhanced chemical vapor deposition.

Figure 1A:
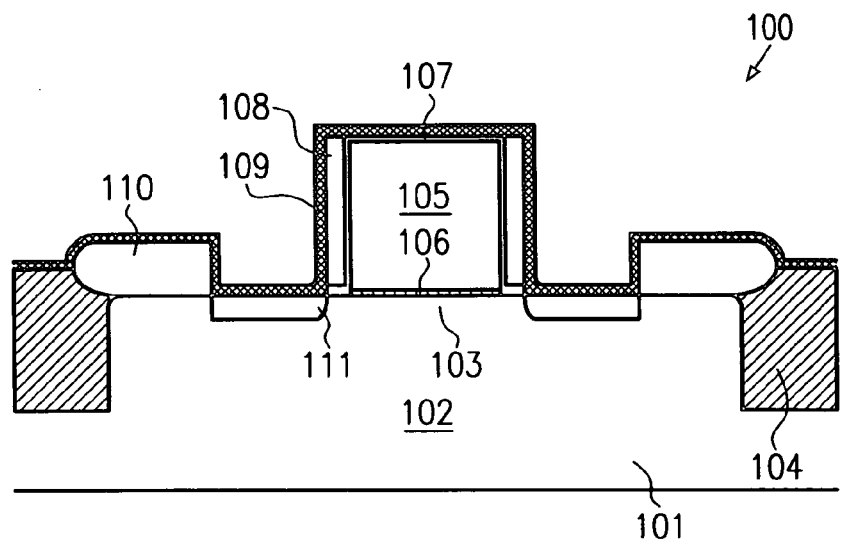
FIGS. 1a-1e schematically show cross-sectional views of a transistor element during various manufacturing stages, wherein a silicon nitride spacer element is formed exhibiting a tensile stress.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously discussed, the sidewall spacers formed adjacent to a gate electrode are widely used in currently practiced CMOS technologies to pattern the lateral dopant profile and/or provide a mask for a self-aligned silicidation process. The spacer elements, typically formed of silicon dioxide or silicon nitride, are produced by depositing a silicon dioxide layer or silicon nitride layer by chemical vapor deposition and, in sophisticated process techniques, by plasma enhanced CVD, as silicon nitride may not be deposited at moderately low temperatures in thermal CVD processes, and by a subsequent anisotropic etch process. During the conventional plasma enhanced deposition process for forming the silicon dioxide layer and/or the silicon nitride layer, process parameters are adjusted to achieve a high material density, resulting in compressive stress in the respective spacer layers and in the finally obtained sidewall spacers. The compressive stress may result in a corresponding compressive stress in a channel region, which may be advantageous for, for instance, P-channel transistors, which, however, negatively influences the performance of N-channel transistors. Furthermore, during the formation of trench isolations, requiring the deposition of silicon dioxide and silicon nitride into deep and narrow trenches and a subsequent oxidation for corner rounding, tensile stress may be created within the trench isolations, which may finally result in a compressive stress within the channel region of the transistor, thereby also negatively affecting the performance of N-channel transistors. According to the present invention, a technique is provided that enables the controllable creation of tensile stress in spacer elements, for example comprised of silicon nitride, silicon oxynitride, and the like, to compensate or over-compensate for compressive stress caused by shallow trench isolations and/or to create tensile stress in the channel regions of, for instance, N-channel transistor elements, thereby improving the electron mobility. Moreover, as previously explained, tensile stress may influence the diffusivity of dopants implanted to produce drain and source regions so that, in combination with correspondingly adapted anneal cycles, a higher degree of dopant activation may be achieved without increasing the thermal budget during the transistor manufacturing process. Consequently, transistor performance may significantly be enhanced while a high degree of compatibility with well-approved process techniques for a given technology node is maintained.

With reference to FIGS. 1a-1e, further illustrative embodiments relating to the formation of silicon nitride spacers having tensile stress will now be described in more detail. FIG. 1a schematically represents a cross-sectional view of a semiconductor device 100 prior to the formation of spacer elements having tensile stress. The semiconductor device 100 comprises a substrate 101, which may represent any appropriate substrate for the formation of integrated circuits, such as a silicon substrate, a silicon-on-insulator (SOI) substrate, any other semiconductor substrate or insulating substrate having formed thereon a substantially crystalline semiconductor layer 102. It should be appreciated that the present invention is particularly useful in combination with a silicon-based semiconductor, as the vast majority of integrated circuits of high complexity, such as microprocessors and the like, are presently formed on the basis of silicon, wherein the substrate 101 is provided in the form of a bulk silicon substrate or an SOI substrate. However, the principles of the present invention may also be applied to semiconductor devices formed of materials other than silicon. The semiconductor device 100 further comprises an isolation structure 104, typically provided in the form of trench isolations in sophisticated integrated circuits, which define a transistor active region in the semiconductor layer 102. A gate electrode 105, for instance comprised of polysilicon, is formed above the semiconductor layer 102 and is separated therefrom by a gate insulation layer 106, which may be comprised of silicon dioxide, silicon nitride, silicon oxynitride, and the like. The gate electrode 105 may be covered by a first oxide liner 107 and by offset sidewall spacers 108, for instance comprised of silicon dioxide, formed on sidewalls of the gate electrode 105. Moreover, a second silicon dioxide liner 109 may cover the gate electrode 105 and the remaining surfaces of the semiconductor device 100. In the embodiment shown in FIG. 1a, raised crystalline regions 110 are formed that may serve as raised drain and source regions after completion of the device 100. It should be noted, however, that the present invention is not restricted to the configuration shown in FIG. 1a, i.e., the present invention may also be applied to conventional transistor designs without raised drain and source regions. Moreover, the provision of the offset spacer 108 depends on process requirements and device dimensions, and hence the offset spacer 108 may not be necessary in other devices. As previously explained, the present invention is advantageous in combination with extremely scaled transistor devices having a gate length, i.e., the horizontal extension of the gate electrode 105 in FIG. 1a, of approximately 60 nm and even less, wherein a further increase of device performance by further size reductions may entail significant efforts, as has been previously discussed. However, the formation of silicon nitride spacer elements with tensile stress may also be considered advantageous for transistor elements having dimensions well above 60 nm.

A typical process flow for forming the semiconductor device 100 as shown in FIG. 1a may comprise the following processes. After forming the trench isolation structure 104 by sophisticated photolithography, etch, and deposition techniques for defining a trench and subsequently filling the trench with dielectric material, such as silicon dioxide and silicon nitride, implantation cycles are performed to establish a vertical dopant profile in the semiconductor layer 102 and the channel region 103. As previously noted, the dopant concentration in the channel region 103 and any compressive stress generated during the formation of the trench isolation structures 104 may affect the charge carrier mobility in the channel region 103 and may lead to a reduced transistor performance, especially for N-channel transistors. Thereafter, the gate electrode 105 and the gate insulation layer 106 may be patterned from a corresponding gate layer stack by well-established photolithography, trim etch, and anisotropic etch techniques. For the example shown in FIG. 1a, an epitaxial growth process may be subsequently performed, for instance by using sacrificial sidewall spacers (not shown) having a width that corresponds to a desired offset of the crystalline regions 110 from the gate electrode 105. Thereafter, the liner 107 and the offset spacer 108, if required, may be formed, for instance by oxidation and sophisticated deposition techniques, respectively. The offset spacers 108 may be used in a subsequent implantation process to form extension regions 111, which exhibit a desired offset to the edge of the gate electrode 105. Finally, the liner 109 is formed, for instance by depositing a thin silicon dioxide layer by plasma enhanced CVD. The liner 109 serves as an etch stop layer for patterning a silicon nitride layer that is subsequently deposited, as will be described with reference to FIG. 1b.

Figure 1B:
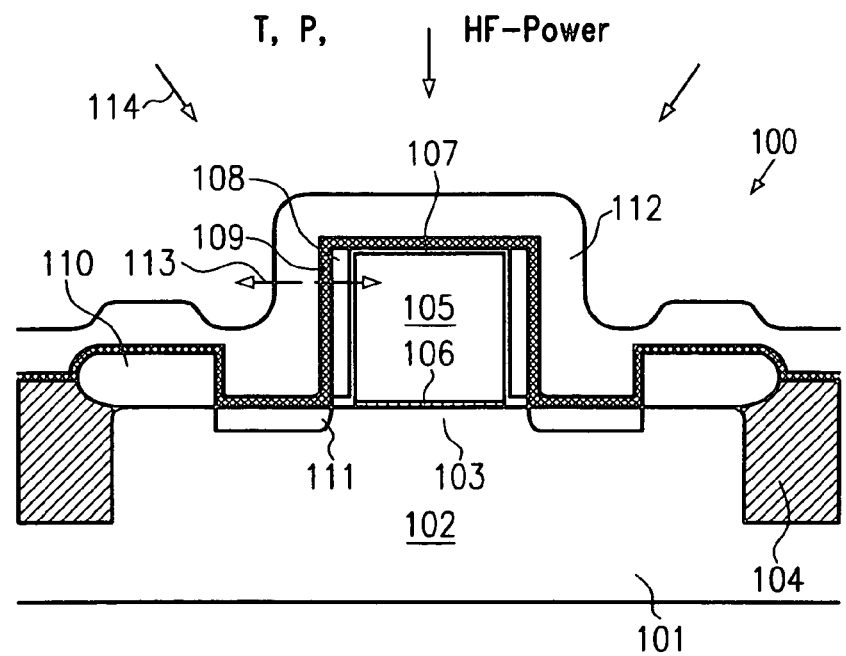

In FIG. 1b, the semiconductor device 100 comprises a spacer layer 112, comprised of silicon nitride, silicon oxynitride, silicon carbide and the like, wherein the spacer layer 112 when comprised of silicon and nitrogen may include a certain amount of hydrogen as is typical for silicon nitride deposited by plasma enhanced CVD, wherein a thickness of the spacer layer 112 is selected in accordance with process requirements, i.e., in accordance with a desired width of the sidewall spacer to be formed from the spacer layer 112. The spacer layer 112 comprises tensile stress, as indicated by 113, wherein the tensile stress 113 may be selected from approximately 0-1000 MPa (Megapascal). In one particular embodiment, the thickness of the spacer layer 112 is in the range of approximately 200-2000 Å with an across-substrate uniformity of approximately 1.5% or less with respect to one standard deviation. The index of refraction may be in the range of approximately 1.90-2.10 with the tensile stress 113 being in the range of approximately 590-710 MPa, which significantly differs from the stress condition of a silicon nitride layer used in conventional processes, wherein the stress is typically a compressive stress having a value of approximately 150 MPa. The hydrogen content (atomic %) of a spacer layer 112 formed in accordance with the present invention is in the range of approximately 22-23%, contrary to approximately 19-21% for a standard compressive stress silicon nitride layer.

The spacer layer 112 may be formed by plasma enhanced CVD in a plasma atmosphere 114, which may be defined by the pressure P prevailing therein, the reactive gases supplied thereto, the high frequency power supplied to the plasma atmosphere 114, for instance, by inductive coupling, a low frequency power or biasing power, the temperature T, wherein the temperature T is substantially defined by the temperature of the semiconductor device 100. The plasma atmosphere 114 may be established in any appropriate CVD tool, as is presently available, which enables providing substantially uniform process conditions over at least one substrate bearing the semiconductor device 100. In one particular embodiment, a CVD system may be used that is available from Novellus Inc. under the trademark SEQUEL. The plasma atmosphere 114 is generated by a supply of high frequency power, for instance, with a frequency in the range of 13-14 MHz, as frequencies in this range are preferably used in industrial applications. It should be appreciated, however, that other frequencies in the range of several MHz to several tens of MHz may also be used, as long as a moderately high efficiency in creating electrons and ionized particles is achieved. Contrary to conventional approaches, the low frequency power, i.e., the bias power delivered within a frequency range from approximately zero to several hundred kHz, supplied to the plasma atmosphere is maintained at a very low level, or is switched off to significantly reduce the kinetic energy of the ionized particles arriving at the surface of the semiconductor device 100 during the deposition process. In this way, the structure of the spacer layer 112 formed during the deposition by means of the plasma atmosphere 114 is created to exhibit a reduced density, thus imparting tensile stress to the spacer layer 112, contrary to the compressive stress used in conventional deposition techniques. In one particular embodiment, silane ($SiH_4$), ammonia ($NH_3$) and nitrogen ($N_2$) are used as precursor materials for a silicon nitride layer, wherein the ratio of these precursor materials is selected to obtain the above-specified optical characteristics and the desired stoichiometric ratio. For instance, for the above-identified PECVD tool, the desired stoichiometric ratio of the spacer layer 112, i.e., the ratio of silicon, nitrogen and hydrogen, is obtained by selecting the flow rates of these gases to approximately 375±37 sccm (standard cubic centimeter/minute) for silane, approximately 3000±300 sccm for ammonia, and approximately 2800±280 sccm for nitrogen. The high frequency power supplied to the plasma atmosphere 114 is selected within a range of approximately 300-400 Watts, wherein the low frequency power is selected between approximately 0-50 Watts, depending on the desired degree of tensile stress. The pressure of the plasma atmosphere 114 is adjusted to approximately 1.2-2.2 Torr, while the temperature is selected within a range of approximately 350-450° C. With these deposition parameters, a deposition rate of approximately 390 Å per minute is achieved.

It should be appreciated that the above-specified parameter values may be readily adapted to any other appropriate deposition tool having a different chamber geometry on the basis of the teaching of this application. For instance, based on the finding that the stress characteristics of the spacer layer 112 significantly depend on the bias voltage applied to the reactive species depositing on the surface of the substrate 101, appropriate parameter values for the pressure, the high frequency power, the temperature and the like may readily be established on the basis of one or more test runs.

Figure 1C:
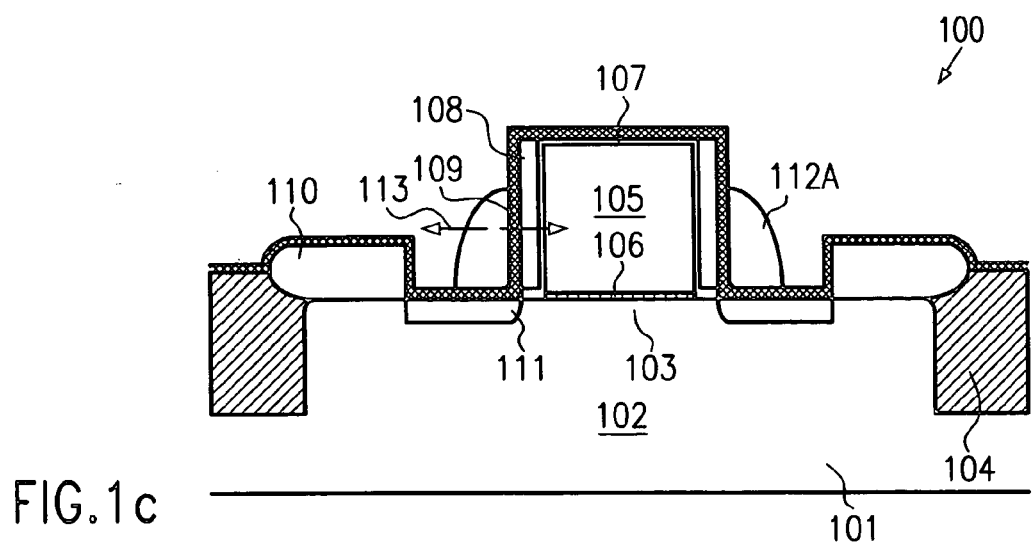

FIG. 1c schematically shows the semiconductor device 100 with spacer elements 112a exposing an upper sidewall portion of the liner 109, which may be advantageous in forming an increased metal silicide region in the gate electrode 105 in a later manufacturing stage. The spacer 112a may be formed in accordance with the conventional process sequence, i.e., by selective anisotropic etching of the silicon nitride of the spacer layer 112 while using the liner 109 as an etch stop layer. During the anisotropic etch process, the amount of over-etch time substantially determines the size of the exposed sidewall portion of the gate electrode 105. Owing to the tensile stress of the spacer layer 112, the spacers 112a also exhibit the tensile stress 113, which may be transferred, at least to a certain amount, to the channel region 103, in particular to areas adjacent to the sidewalls of the gate electrode 105. As previously discussed, the tensile stress 113 may result in an enhanced electron mobility and may also lead to an increased diffusivity of dopants that are implanted into the region 102, wherein the spacer elements 112a act as implantation masks. Thus, the dopant activation in a subsequent anneal cycle may be significantly more efficient and hence may result, despite the increased diffusivity, in a reduced overlap of the extension region 111 with the gate electrode 105, thereby reducing the Miller capacitance of the semiconductor device 100. Moreover, the compressive stress that may be imparted to the channel region 103 by the trench isolation structures 104 may be compensated for or may be reduced by the tensile stress 113 created by the spacers 112a. As a consequence, the transistor performance of N-type transistors may be significantly improved by providing the spacers 112a having the tensile stress 113.

Figure 1D:
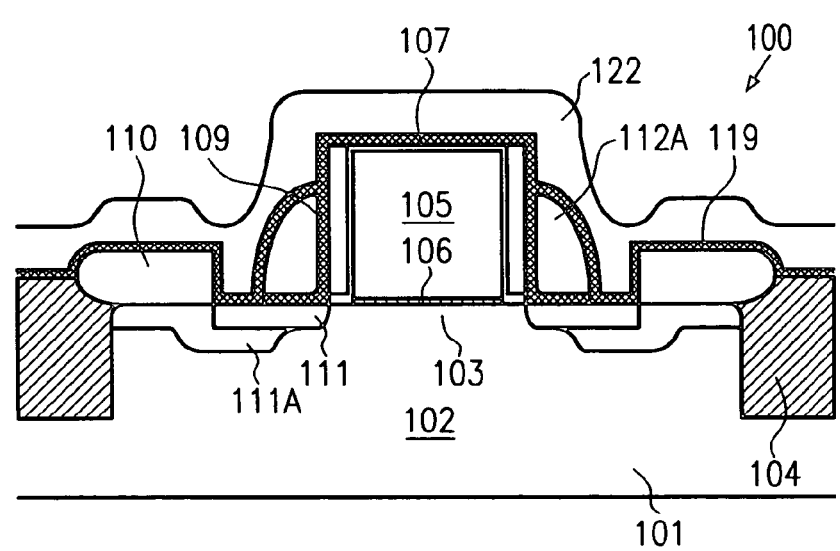

FIG. 1d schematically shows the semiconductor device 100 in a further advanced manufacturing stage, when the lateral dopant profile of drain and source regions still to be formed require a further implantation process with an additional spacer element. Hence, the semiconductor device 100 comprises an additional oxide liner 119 covering all of the exposed surfaces. Moreover, a further spacer layer 122, comprised of silicon nitride, exhibiting stress conditions similar to those of the spacer layer 112 (FIG. 1b), is formed above the substrate 101, wherein the amount of tensile stress may be adjusted by correspondingly selecting the deposition parameters in the plasma atmosphere 114 when used for the formation of the spacer layer 122.

Figure 1E:
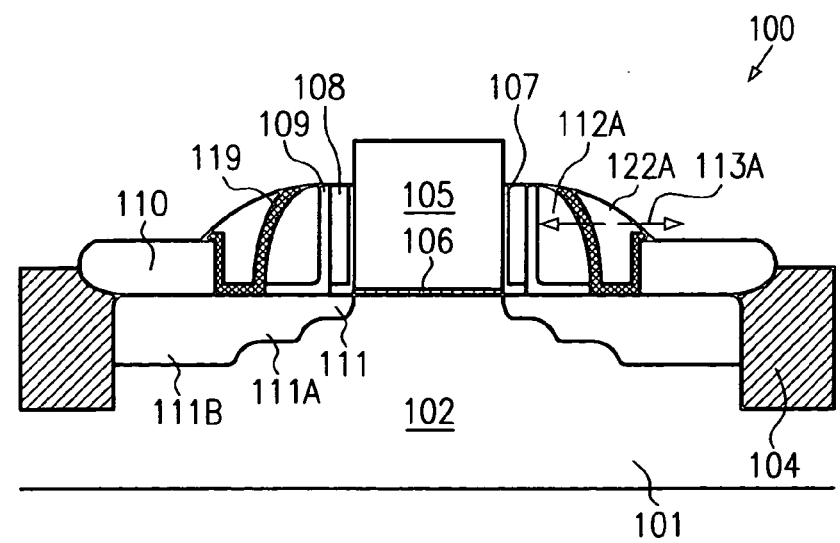

FIG. 1e schematically shows the semiconductor device 100 with second silicon nitride spacers 122a formed from the spacer layer 122. Moreover, drain and source regions are formed within the layer 102, including the extension regions 111 and deeply implanted regions 111a, 111b formed by means of the spacers 112a, 122a, respectively. Furthermore, surface portions of an upper area of the gate electrode 105 are exposed. The patterning of the spacer 122a may be accomplished in a similar way as is described with reference to the spacers 112a.

Due to the spacers 112a and 122a, each exhibiting a specified amount of tensile stress, a combined tensile stress 113a is generated, which may, as previously discussed, significantly improve the electrical performance of the semiconductor device 100 after completion. It should be appreciated that the formation of spacer elements having tensile stress is not restricted to the triple spacer approach shown in FIGS. 1a-1e, but may be implemented in any manufacturing sequence, irrespective of whether one, two or four or more spacers are required for appropriately providing the dopant concentration in the drain and source regions.

Figure 2:
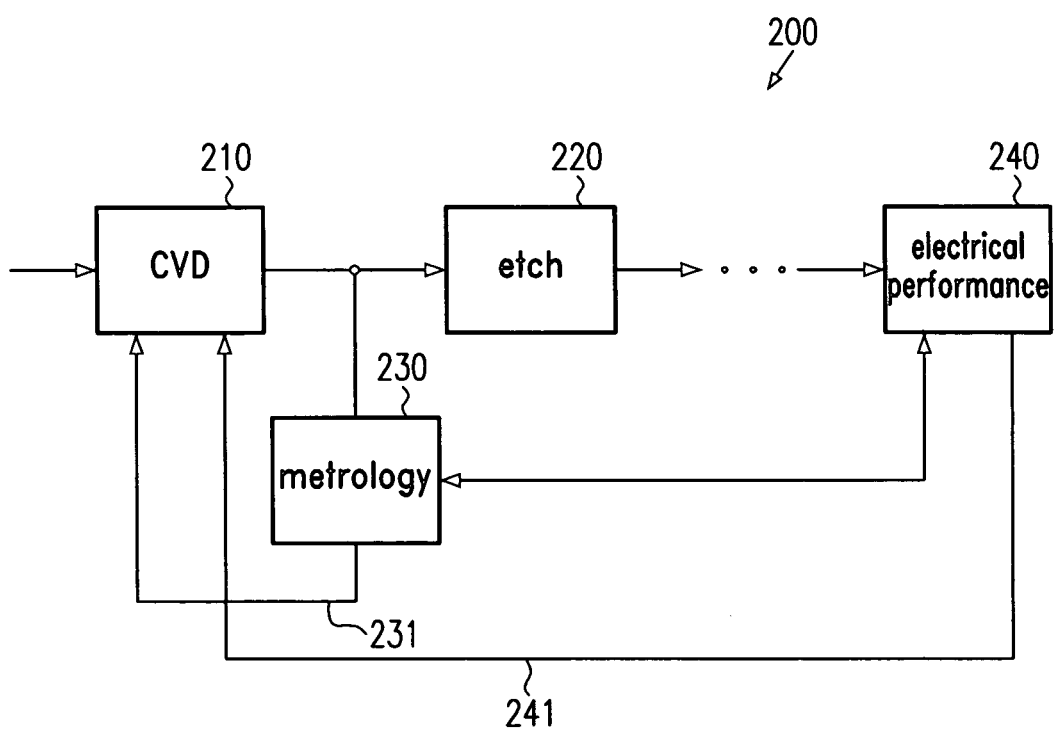
FIG. 2 is a sketch of a manufacturing sequence including a plurality of process tools involved in manufacturing transistors with spacer elements exhibiting an adjustable amount of stress, wherein various relations between the process tools are established to improve controllability for creating the desired stress.

FIG. 2 schematically shows a process sequence 200 for forming a transistor element including spacer elements having tensile stress, such as the device 100. The process sequence may involve process tools including metrology tools used for forming spacer elements in accordance with the present invention. A deposition tool 210, such as the above-specified SEQUEL™ tool from Novellus, is provided and is operated within the above-specified process parameter values to enable the formation of a spacer layer having intrinsic tensile stress. Downstream from the deposition tool 210, an etch tool 220 is provided, which is configured to anisotropically etch the spacer layers to form spacer elements having intrinsic tensile stress. Downstream from the etch tool 220, a metrology tool 240 is provided that is configured to obtain measurement data on the electrical performance of a transistor element including the spacer elements having the intrinsic tensile stress. For convenience, any process tool upstream or downstream of the deposition tool 210 and the etch tool 220 for performing processes required to complete the transistor elements are not shown in FIG. 2. Moreover, additional metrology tools, such as a tool 230, may be provided at certain points of the process sequence 200. For instance, the metrology tool 230 may be arranged with respect to the process flow between the deposition tool 210 and the etch tool 220 to assess the stress condition of the spacer layer as deposited. The metrology tool 230 may comprise optical instruments that are configured to determine the amount of stress within a material layer by, for instance, Raman spectroscopy. In other embodiments, the metrology tool 230 may comprise optical and/or mechanical instruments configured to determine a curvature of a substrate, wherein the curvature may be related to the stress created by a material deposited on the substrate. In still other embodiments, the metrology tool 230 may comprise a scanning electron microscope so as to determine intrinsic stress characteristics of the spacer layer. In one embodiment of the present invention, measurement data obtained from the metrology tool 240 indicative of the electrical performance may be correlated to corresponding measurement results obtained by the metrology tool 230 to assess the presently used parameter setting of the deposition tool 210. That is, the electrical performance of a plurality of devices formed on a plurality of substrates may be determined and may be assigned to specified deposition conditions as are indicated by the metrology tool 230. A corresponding assignment may be established for a plurality of different deposition parameters, for instance, for different settings of the low frequency power supplied to the plasma atmosphere in the deposition tool 210, to obtain a relationship between the electrical performance and one or more process parameters relevant for the creation of intrinsic tensile stress in the spacer elements. It should be appreciated that the electrical performance data may not necessarily be obtained from product substrates, but may also be gathered by means of specifically designed test structures and the like. During the actual manufacturing sequence 200, electrical performance data are obtained with a significant delay with respect to the deposition process in the tool 210, so that a corresponding feedback loop, indicated as 241, may be efficient for long-term fluctuations only, but may not provide the potential for responding to process variations on a wafer scale or lot scale. Thus, on the basis of the previously established correlation between the electrical performance data and the measurement data as obtained by the metrology tool 230, a corresponding fast-responding feedback loop 231 may be established, since the metrology tool 230, if implemented in the form of an optical and/or mechanical measurement instrument, may provide measurement results even on a wafer basis, thereby enabling an immediate re-adjustment of one or more process parameters affecting the intrinsic tensile stress in the spacer layer formed by the tool 210. In other embodiments, the correlation between electrical performance data and measurement data of the tool 230 may be updated continuously, or on a regular basis, by measuring the electrical performance of product substrates to enhance the robustness of the control process. Moreover, the correlation may be used to monitor the efficiency of the overall process sequence 200 by identifying a fluctuation that is not caused by the plasma enhanced deposition process in the tool 210 when the electrical performance data indicate a correction of the at least one process parameter controlling the intrinsic tensile stress that is outside of a valid specified range. For example, if a valid adjustment range of, for instance, the low frequency power supplied to the plasma atmosphere in the tool 210 is set to 0-10 Watts, which may correspond to an intrinsic tensile stress in the spacer layer of approximately 650-550 MPa, and the electrical performance data gathered by the tool 240 request, after a certain period of manufacturing, a value for the low frequency power outside of the specified range, a considerable fluctuation in any other process of the sequence 200 may have occurred and may be indicated to an operator or a facility management system. Hereby, the measurement data provided by the metrology tool 230 may enable the estimation of the degree to which the deposition tool 210 has contributed to this process fluctuation. Hence, process stability may be enhanced while at the same time device performance is improved due to the plasma enhanced deposition process enabling the formation of spacers having an adjustable intrinsic tensile stress.

With reference to FIGS. 3*a*-3*f*, further illustrative embodiments will now be described, wherein spacer elements of different stress characteristics are formed at different transistor elements. As previously stated, different types of transistors may require a different stress characteristic to increase the overall performance of an integrated circuit. The following embodiments are directed to the selective creation of different stress in spacer elements while not unduly contributing to process complexity.

Figure 3A:
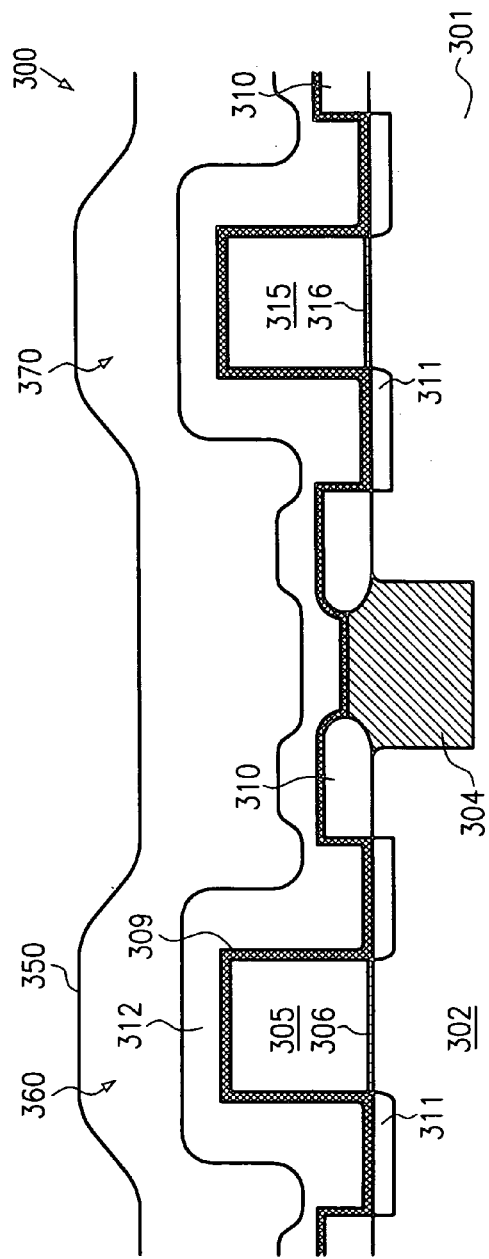

FIG. 3*a* schematically shows a cross-sectional view of a semiconductor device 300 including a first transistor element 360 and a second transistor element 370, which may represent an N-channel transistor and a P-channel transistor, respectively, or which may represent any two transistor elements on a die or substrate requiring the formation of spacer elements having different stress characteristics. The device 300 further comprises a substrate 301 having formed thereon a semiconductor layer 302 including an isolation structure 304, for instance, in the form of a trench isolation structure, separating the transistor elements 360 and 370. The transistor element 360 comprises a gate electrode 305 separated from the semiconductor layer 302 by a gate insulation layer 306. Similarly, the transistor element 370 comprises a gate electrode 315 that is separated from the semiconductor layer 302 by a corresponding gate insulation layer 316. Regarding the dimensions of the gate electrodes 305, 315 and the gate insulation layers 306, 316 as well as the material composition thereof, the same criteria apply as previously pointed out with reference to FIG. 1*a*. Moreover, the semiconductor device 300 may comprise epitaxially grown semiconductor regions 310 and corresponding extension regions 311, wherein the type of dopants and the dopant concentration in the regions 311 may differ for the transistors 360 and 370. An oxide liner 309 followed by a spacer layer 312, comprised of silicon nitride, is formed over the substrate 301 and the gate electrodes 305, 315. Finally, a sacrificial layer 350, for instance comprised of silicon dioxide, is formed to completely cover the transistor element 360, 370.

A typical process flow for forming the device 300 as shown in FIG. 3*a* may comprise substantially the same processes as are described with reference to FIG. 1*a*, wherein particularly the plasma enhanced CVD process for forming the spacer layer 312 may be performed in accordance with the process parameters as specified above. Moreover, the layer 350 may be deposited by plasma enhanced CVD in accordance with well-established process recipes.

Figure 3B:
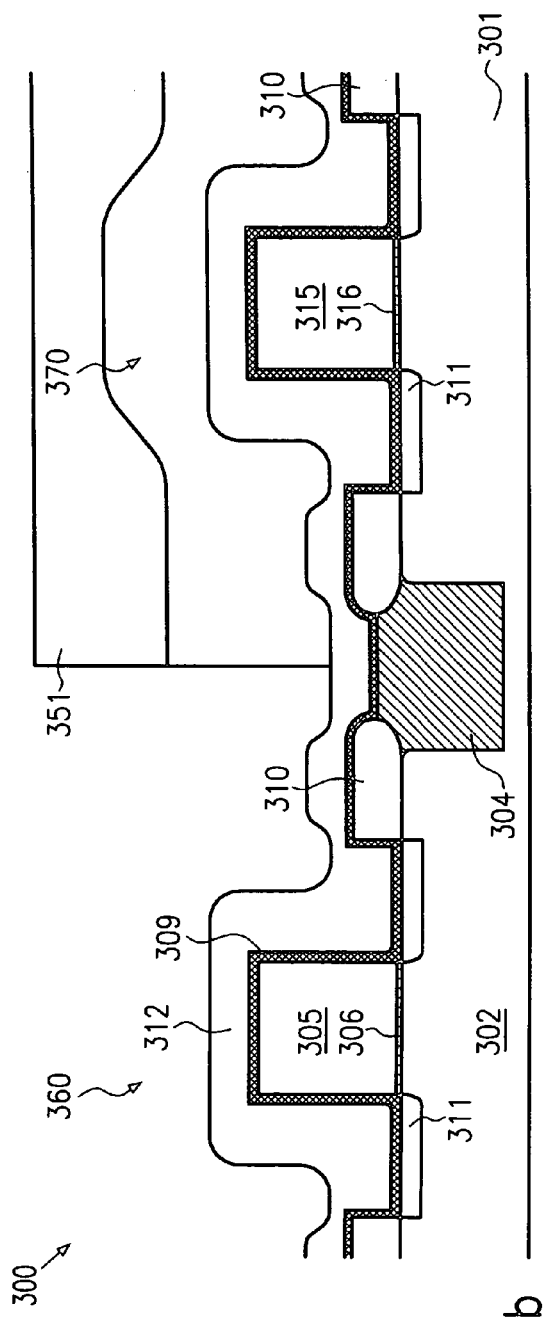

FIG. 3*b* schematically shows the device 300 in an advanced manufacturing stage. A mask layer 351, for instance comprised of photoresist, is formed above the transistor element 370, while the layer 350 is removed from the transistor element 360. The removal of the layer 350 above the transistor 360 may be accomplished by a selective anisotropic etch process, wherein the spacer layer 312 acts as an etch stop layer, while the mask layer 351 prevents or at least slows down the etching of the layer 350 above the transistor element 370. The mask layer 351 may be formed in accordance with well-established photolithography techniques, as are also used in providing implantation masks for selectively doping P-type transistors and N-type transistors in the CMOS process flow. In one embodiment, when the topography of the layer 350 is considered inappropriate for the formation of the resist mask 351, a CMP (chemical mechanical polishing) process may be performed to planarize the surface of the layer 351 prior to the formation of the mask layer 351. Subsequently, the exposed portion of the spacer layer 312 may be removed by an isotropic selective etch process, wherein the liner oxide 109 acts as an etch stop layer.

Figure 3C:
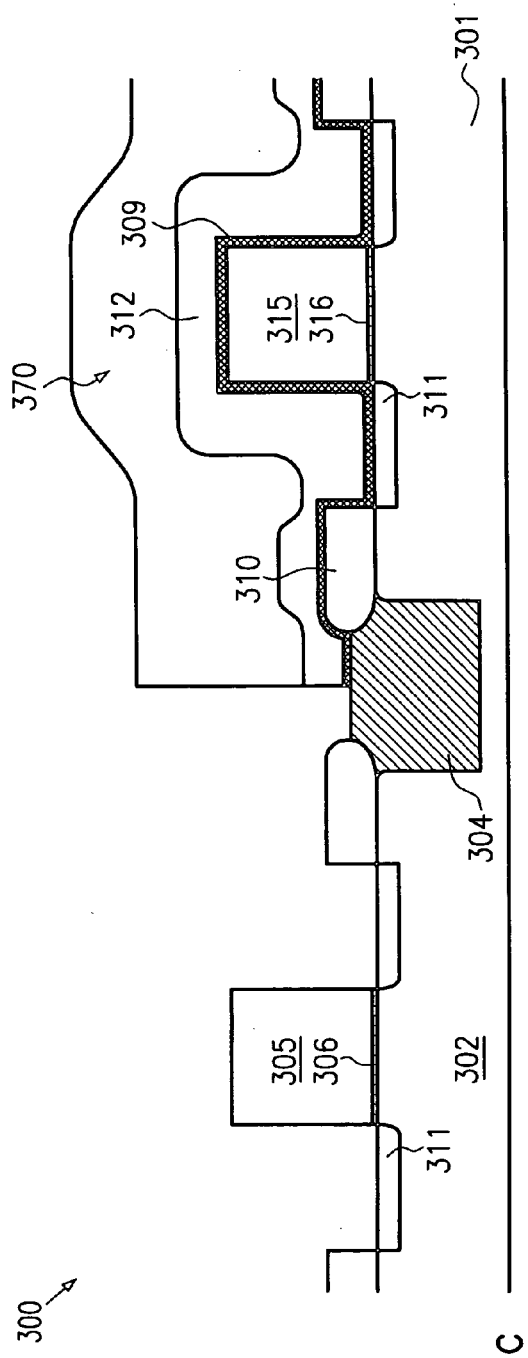

FIG. 3c schematically depicts the device 300 after removal of the spacer layer 312 and the underlying oxide liner 309 from the transistor element 360.

Figure 3D:
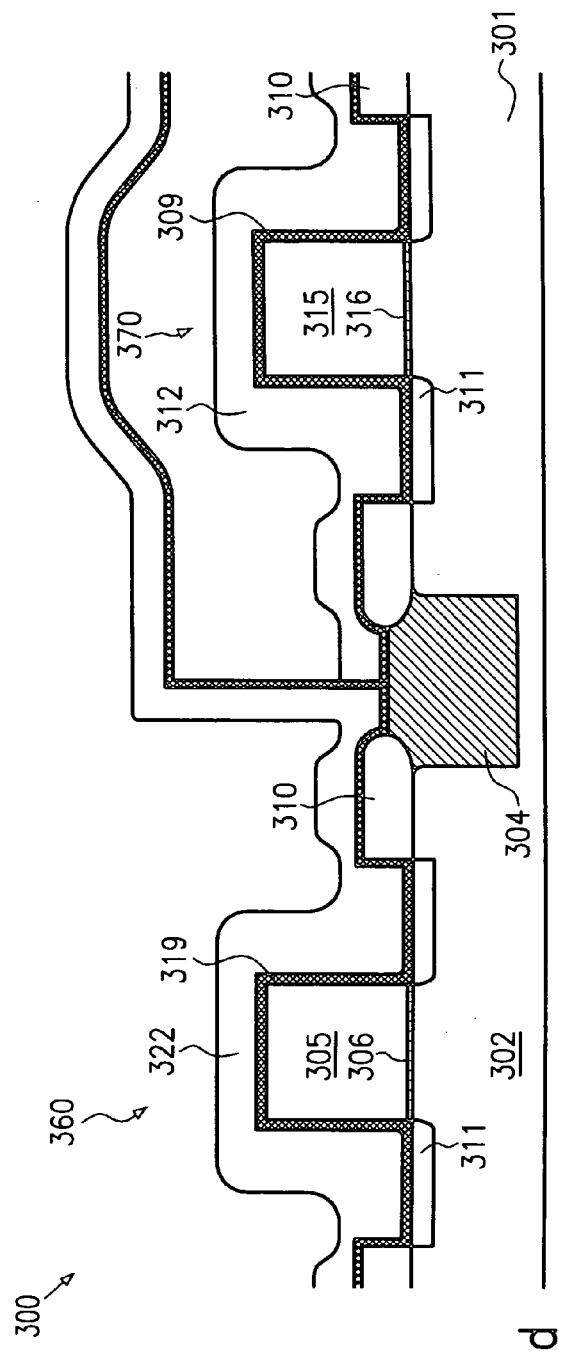

FIG. 3d schematically shows the device 300 with a further oxide liner 319 followed by a further spacer layer 322 formed over the transistor element 360 and on the remaining portion of the layer 350. During the deposition of the spacer layer 322, comprised of silicon nitride, the stress characteristics thereof may be selected to correspond to the transistor element 360. For instance, if tensile stress is required for the transistor 360, the process parameters may be selected as discussed with reference to the spacer layer 112 and 122 in FIGS. 1b-1e. In other embodiments, compressive stress may be considered appropriate for the transistor element 360, and correspondingly a conventional deposition recipe may be used for forming the spacer layer 322. It should further be appreciated that in addition to differently selecting the intrinsic stress characteristics for the transistor element 360 and 370, the thickness of the spacer layers 322 and 312 may be selected in conformity with device requirements, thereby providing additional design flexibility in laterally profiling the respective dopant concentrations.

After the formation of the spacer layer 322 in accordance with one embodiment, the topography of the device 300 may be planarized by depositing a polymeric material to substantially fill the transistor element 360 to a level that substantially corresponds to that of the transistor 370. In other embodiments, the device 300 as shown in FIG. 3d may be subjected to a CMP process without a preceding adjustment of the topography.

FIG. 3e schematically shows the device 300 after the completion of the CMP process in which the spacer layer 312 is removed from the top surface of the layer 350. As depicted in FIG. 3e, the control of the CMP process is not critical since a significant amount of the horizontal portions of the layers 322 and 312 may be removed without affecting the further manufacturing process. In other embodiments, the CMP process may be performed in such a manner that merely the layer 322 on top of the layer 350 is reliably removed, thereby leaving behind a significant portion of the layer 350 above the transistor 370. Irrespective of the process strategy used, the remaining material of the layer 350 may then be removed by a selective etch process, for instance using HF. Thereafter, an anisotropic etch process may be performed to commonly pattern the spacer layers 322, 312 to form respective spacer elements.

FIG. 3f schematically shows the semiconductor device 300 after completion of the anisotropic etch process and after the removal of the liner oxides 309 and 319. Hence, the gate electrode 305 has formed thereon spacer elements 322a exhibiting a stress characteristic 313a, while the gate electrode 315 has formed thereon spacer elements 312 that exhibit a stress characteristic 313, which differs from the stress characteristic 313a. A remaining portion 322b of the spacer layer 322, which is created by the anisotropic etch process for forming the spacers 322a, 312a, is located above the isolation structure 304 and substantially does not negatively influence the performance of the transistor elements 360 and 370, nor is the further manufacturing process adversely affected. The manufacturing process for the device 300 may then be continued with the formation of further spacer elements (not shown), wherein the processes described above may correspondingly be repeated to obtain the transistor elements 360, 370, similar to that described in FIG. 1e.

As pointed out with reference to FIG. 1e, the device 300 may be manufactured in accordance with any required process strategy, i.e., one or more spacer elements may be formed for at least two different transistor types to achieve the required lateral dopant profile. Moreover, offset spacers as are described, for instance in FIG. 1a, may also be used in the device 300. Furthermore, the control strategy described with reference to FIG. 2 may also be applied to the manufacturing sequence of the device 300, since the intrinsic stress characteristics of the spacer layers 312 and 322 may be separately adjusted by correspondingly controlling at least one deposition parameter, such as temperature and/or pressure and/or low frequency power of the plasma atmosphere during the deposition of the spacer layers 312 and 322.

In a further embodiment (not shown), the mask layer 350 may be formed by, for example, a resist layer, which may be patterned to expose the transistor element 360. Thereafter, the spacer layer 312 may be removed followed by the removal of the resist layer 350. Thereafter, the second spacer layer 322 having a specified stress characteristic, for instance exhibiting compressive stress, may be deposited over the first and second transistor elements 360 and 370, thereby forming a stack of the layers 312 and 322 over the second transistor element 370. The stress and the thickness of the first spacer layer 312 may be selected to obtain, in combination with the second spacer layer 322, a desired effect with respect to the total stress and the total spacer width for the second transistor element 370. Thus, the spacer width may individually be adapted to the first and second transistor elements 360 and 370 by correspondingly selecting the thickness of the first and second spacer layers 312 and 322. For example, if the second transistor element 370 is to receive a tensile stress spacer with a width that may exceed the width of a compressive stress spacer to be formed at the first transistor element 360 by 20%, the thickness of the spacer layer 312 may be selected to be approximately 20% of the thickness of the spacer layer 322. The tensile stress in the layer 312 may be selected to a moderately high value of, for instance, 900 MPa to compensate for the significantly lower compressive stress, for instance of about −50 MPa, of the spacer layer 322. In a common etch process, corresponding spacers having different stress and different width may then be formed in a similar fashion as is described with reference to FIGS. 3e and 3f.

As a result, the present invention provides a deposition technique in a plasma atmosphere which enables the formation of a spacer layer having tensile stress to pattern corresponding spacer elements that may impart a required amount of stress to a gate electrode and/or a channel region of a respective transistor element. The deposition parameters established for a Novellus SEQUEL™ tool may be readily transferred to any appropriate PECVD tool based on the parameter values described herein. The process for forming tensile spacers, such as silicon nitride spacers, significantly improves the device performance and may advantageously be combined with control strategies and process flow modifications as described above, thereby still further improving performance and production yield.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming spacer elements, the method comprising:
   forming a gate electrode above a semiconductor region;
   forming at least one trench isolation in the semiconductor region, thereby creating a compressive stress in a channel region beneath the gate electrode;
   depositing in a high frequency plasma atmosphere a spacer layer having tensile stress over said gate electrode and said semiconductor region, wherein depositing said spacer layer comprises controlling a bias voltage in said high frequency plasma atmosphere to adjust a degree of tensile stress in said spacer layer such that the tensile stress in said spacer layer compensates for the compressive stress in the channel region; and
   etching said spacer layer to form a spacer element having tensile stress.

2. The method of claim 1, wherein said layer is comprised of silicon and nitrogen.

3. The method of claim 1, wherein said bias voltage is controlled by adjusting a low frequency power supplied to said high frequency plasma atmosphere.

4. The method of claim 3, wherein said low frequency power is adjusted within a range of approximately 0-50 Watts.

5. The method of claim 1, wherein said low frequency power is adjusted to approximately zero.

6. The method of claim 1, wherein, for a desired stoichiometric ratio of said spacer layer, a degree of said tensile stress is adjusted by at least one of a deposition temperature, deposition pressure and an amount of high frequency power supplied to said plasma atmosphere such that the tensile stress compensates or overcompensates for the compressive stress in the channel region, thereby creating zero stress or a tensile stress in the channel region.

7. The method of claim 6, wherein said deposition temperature is selected in a range of approximately 350-450° C. when said spacer layer is comprised of silicon and nitrogen.

8. The method of claim 6, wherein said deposition pressure is selected in the range of approximately 1.2-2.2 Torr.

9. The method of claim 6, wherein said amount of high frequency power is selected in the range of approximately 300-400 Watt for a single substrate process with a substrate having a diameter of 200 mm.

10. The method of claim 1, further comprising forming a drain region and a source region adjacent to said spacer element while using said spacer element as an implantation mask.

11. The method of claim 1, wherein said gate electrode has a gate length of approximately 60 nm or less.

12. The method of claim 1, further comprising controlling at least one deposition parameter of said plasma atmosphere on the basis of a measured characteristic of said gate electrode to adjust the degree of tensile stress provided by said spacer element such that the tensile stress compensates or overcompensates for the compressive stress in the channel region, thereby creating zero stress or a tensile stress in the channel region.

13. The method of claim 12, wherein said at least one process parameter represents at least one of a high frequency power, a bias power and a pressure.

14. The method of claim 12, wherein controlling said at least one deposition parameter comprises determining said measured characteristic for at least one substrate, determining a desired value for said at least one deposition parameter and depositing said spacer layer on one or more product substrates by using said desired value.

15. The method of claim 14, wherein said measured characteristic comprises at least one of an operating speed of a transistor formed with said gate electrode and said channel region, a Raman spectrum and an electron microscope reading.

* * * * *